United States Patent [19]

Faris

[11] 4,151,605
[45] Apr. 24, 1979

[54] SUPERCONDUCTING MEMORY ARRAY CONFIGURATIONS WHICH AVOID SPURIOUS HALF-SELECT CONDITION IN UNSELECTED CELLS OF THE ARRAY

[75] Inventor: Sadeg M. Faris, Yorktown Heights, N.Y.

[73] Assignee: International Business Machines Corporation, Armonk, New York 10504

[21] Appl. No.: 853,955

[22] Filed: Nov. 22, 1977

[51] Int. Cl.² .............................................. G11C 11/44
[52] U.S. Cl. .................................... 365/162; 307/212; 307/306; 357/5
[58] Field of Search ..................... 365/161, 162, 160; 307/306, 212; 357/5

[56] References Cited

PUBLICATIONS

Barnard, Sheet Film Drive Matrix, IBM Technical Disclosure Bulletin, vol. 7, No. 1, 6/64, pp. 114–115, 307/306.

*Primary Examiner*—Stuart N. Hecker
*Attorney, Agent, or Firm*—Thomas J. Kilgannon, Jr.

[57] ABSTRACT

A number of memory array configurations which avoid a spurious half-select condition in unselected cells of a superconducting memory array is disclosed. The memory arrays incorporate memory cells which include at least single Josephson junction disposed in a superconducting loop wherein binary information is stored in the form of at least one circulating current. By providing means for applying a control magnetic field to only the selected memory cell, spurious writing of an unselected memory cell is avoided. This is accomplished in a number of embodiments by causing the application of the half-select current (which normally provides the control magnetic field to a memory cell) to divert a previously applied half-select or enabling current to the memory cell into another path so that the previously applied half-select or enabling current now acts as a control current for switching the storage gate of the selected memory cell. Diverson of the enabling current is, in turn, achieved by the switching of a serially disposed Josephson device which switches in response to the presence of two half-select currents in that device. Any othersimilarly serially disposed device in an unselected memory cell encounters only a single half-select current and, under such circumstances, cannot switch to control its associated storage gate. Any other unselected cell encounters, at most, a single half-select current.

24 Claims, 6 Drawing Figures

SUPERCONDUCTING MEMORY ARRAY CONFIGURATIONS WHICH AVOID SPURIOUS HALF-SELECT CONDITION IN UNSELECTED CELLS OF THE ARRAY

BACKGROUND OF THE INVENTION

1. Field of the Invention

This invention relates generally to superconductive memory cells wherein information is stored in the cells in the form of at least a single circulating current. More specifically, it relates to memory array configurations which avoid a spurious half-select condition in unselected cells of the memory array. Still more specifically, it relates to superconductive memory cells wherein binary information is stored in a storage loop in the form of one or two circulating currents by the switching of at least a single storage device disposed in the storage loop. Still more specifically, it relates to superconductive memory cells wherein means are connected to the memory cells for applying at least a control magnetic field to only a selected one of the memory cells simultaneously with the application of an enabling current in the storage device of the storage loop. In some instances, the enabling current is diverted into a path, a portion of which is disposed in electromagnetically coupled relationship with the storage device, under control of a switchable device which diverts the enabling current into the path. In another instance, the memory cell storage loop is disposed in series in a path into which the enabling current is diverted and the diversion path is in parallel with a switchable device which itself is switched to divert the enabling current into its associated parallel path. In other instances, a current different from the enabling current is utilized to switch the storage device of a selected one of the memory cells. In these arrangements, either the enabling current or a separate current triggers a switchable device which diverts these currents into a path in parallel with the switchable device. This path has a portion disposed in electromagnetically coupled relationship with the storage device of the selected one of the memory cells which can switch when both the enabling current and a control magnetic field are encountered by the storage device of only the selected memory cell. In all the above-described arrangements, only the selected one of the memory cells encounters an enabling current and a control magnetic field which is sufficient to store information in the selected cell in the presence of a stored circulating current. Thus, the storage device of an adjacent memory cell in the same row encounters neither an enabling current nor a control magnetic field current. The storage device encounters, at most, a previously stored circulating current. Similarly, unselected cells in the same column of an array only encounter a half-select enabling current and possibly a circulating current, the sum of which are always well below the threshold current ($I_{mo}$) of the storage gate. Thus all of the present arrangements avoid the situation where the combination of control magnetic field applied to more than one storage device (global) and stored circulating current can cause spurious switching of an unselected memory cell by applying control magnetic field to only one storage device (local).

1. Description of the Prior Art

The following patent and articles relate to superconductive memory cells which utilize at least a single storage device in a storage loop wherein binary information is stored in the form of at least a single circulating current. All of the memory cells shown utilize coincident current selection to store information and the coincident currents are applied in such a way that both selected and unselected cells encounter a control magnetic field (global). The memory cells of the present application are distinguishable over all the below-cited prior art inasmuch as only a selected one of the memory cells encounters a control magnetic field (local).

U.S. Pat. No. 3,626,391, Ser. No. 744,949, filed July 15, 1968 entitled "Josephson Tunneling Memory Array Including Drive Decoders Therefor" in the name of W. Anacker and assigned to the same assignee as the present application.

IBM Technical Disclosure Bulletin, Vol. 15, No. 2, July 1972, p. 449–451, "Memory Cell Using a Single Josephson Tunneling Gate," by W. Anacker.

IBM Technical Disclosure Bulletin, Vol. 15, No. 9, February 1973, p. 2904–2905, "NDRO Memory Cell Employing a Single Josephson Tunneling Gate," by W. Henkels.

IBM Technical Disclosure Bulletin, Vol. 16, No. 1, June 1973, p. 214, "Two-Junction Josephson Memory," by P. Wolf.

IBM Technical Disclosure Bulletin, Vol. 18, No. 11, April 1976, p. 3852–3855, "Josephson Feedback Memory Cells," by W. H. Henkels.

SUMMARY OF THE INVENTION

In accordance with the broadest aspect of the present invention, a superconductive random access memory is disclosed comprising a plurality of memory cells arranged in array fashion wherein information is stored in individual memory cells in the form of at least a single circulating current. Also included are means coupled to a plurality of portions of the memory cells for applying an enabling current to one of the portions which includes a selected one of the memory cells. In addition, means connected to the memory cells for applying at least a control magnetic field to only a selected one of the memory cells simultaneously with the enabling current to store information in the selected one of the memory cells are provided.

In accordance with the broadest aspects of the present invention, a superconductive random access memory is disclosed wherein the memory cells of the array each include a storage loop having at least an actuable device capable of carrying Josephson current disposed therein and wherein the means for applying an enabling current includes a selectively separately actuable current source serially connected to each of the portions.

In accordance with the broader aspects of the present invention, a superconducting random access memory is disclosed wherein the means for applying at least a control magnetic field to only a selected one of said memory cells simultaneously with the enabling current includes means for diverting the enabling current into electromagnetically coupled relationship with the actuable device of the selected one of the memory cells.

In accordance with the broader aspects of the present invention, a superconductive random access memory is disclosed wherein the means for applying at least a control magnetic field to only one of the memory cells simultaneously with the enabling current includes means for diverting a current different from the enabling current into electromagnetically coupled relationship with the actuable device of the selected one of the memory cells.

In accordance with more particular aspects of the present invention, a superconductive random access memory array is disclosed wherein the means for diverting the enabling current into electromagnetically coupled relationship with the actuable device of the selected one of the memory cells includes a switchable device disposed in series with the selected one of the memory cells. It also includes a current path shunting the switchable device; a portion of the current path being disposed in electromagnetically coupled relationship with the actuable device of the selected one of the memory cells. In addition, means disposed in electromagnetically coupled relationship with the switchable device for switching it to divert the enabling current into the portion of the current path and to switch the actuable device of the selected one of the memory cells are included.

In accordance with more particular aspects of the present invention, a superconductive random access memory is disclosed wherein the means for diverting the enabling current into electromagnetically coupled relationship with the actuable device of the selected one of the memory cells includes a switchable device disposed in series with a current source and in parallel with the selected one of the memory cells. It further includes a current path shunting the switchable device; the current path being disposed in series with the selected one of the memory cells and having a portion thereof disposed in electromagnetically coupled relationship with the actuable device of the selected one of the memory cells. In addition, it includes means disposed in electromagnetically coupled relationship with the switchable device for switching it to divert the enabling current into the portion of the current path and to switch the actuable device of the selected one of the memory cells.

In accordance with more particular aspects of the present invention, a superconductive random access memory is disclosed wherein the means for diverting a current different from the enabling current into electromagnetically coupled relationship with the actuable device of the selected one of the memory cells includes a selectively actuable source of current different from the enabling current. It further includes a switchable device disposed in series with the selectively actuable source and a superconductive current path shunting the switchable device. A portion of the latter is disposed in electromagnetically coupled relationship with the actuable device of the selected one of the memory cells. In addition, means disposed in electromagnetically coupled relationship with the switchable device for switching it to divert the current different from the enabling current into the portion of the current path and to switch the actuable device of the selected one of the memory cells are included.

It is, therefore, an object of this invention to provide a memory array where only the selected cell of the memory array is subjected to a control magnetic field to store information in the memory cell.

Another object is to provide a superconductive random access memory wherein the inherent operating margins are enhanced over those of known memory arrays.

Still another object is to provide a superconductive random access memory wherein a special preset cycle is not required.

Still another object is to provide a superconductive random access memory wherein control magnetic field is applied to the memory array locally rather than globally.

The foregoing and other objects, features and advantages of the invention will become apparent from the following more particular description of the preferred embodiment of the invention as illustrated in the accompanying drawings.

DESCRIPTION OF PREFERRED EMBODIMENT

To fully appreciate the contribution of the present application, a rather detailed description and operation of a prior art superconductive random access memory will be given hereinbelow in connection with the schematic diagram of FIG. 1.

Figure 1:
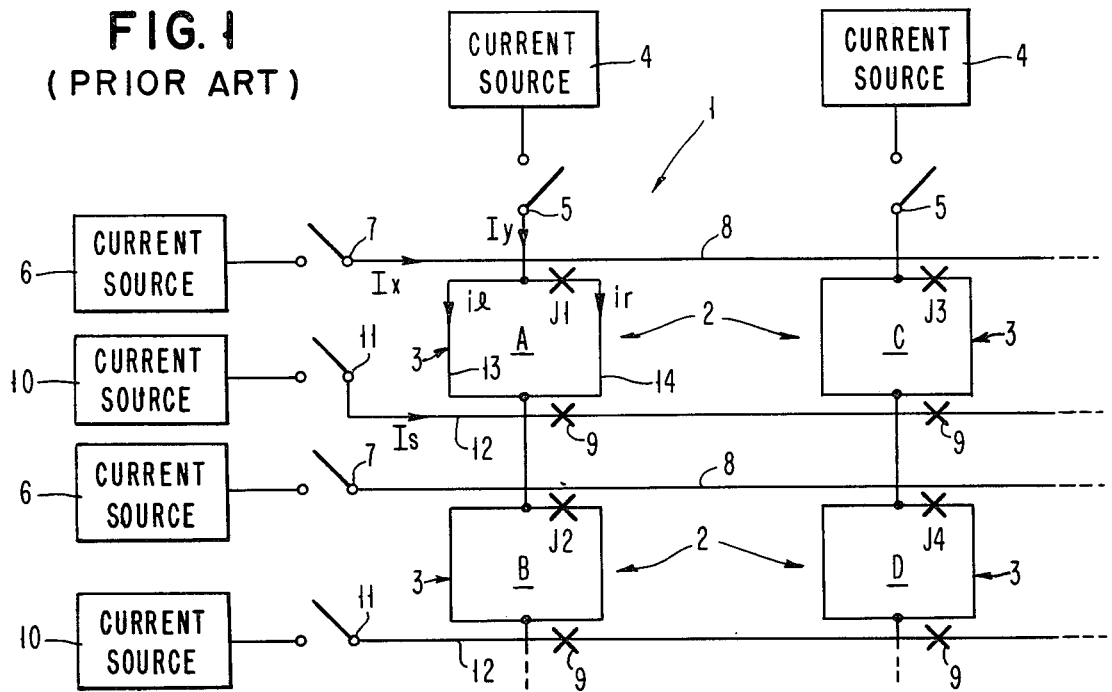
FIG. 1 is a schematic diagram of a portion of a prior art superconductive random access memory wherein the control magnetic field applied to the storage cell of a selected memory cell is also applied to the storage gate of an unselected memory cell (global). Under such circumstances and because of poor margins, information can be written spuriously into the unselected memory cell.

FIG. 1 shows a portion of a superconductive memory array 1 wherein binary information is stored in memory cells 2 in the form of at least a single circulating current. In the arrangement of FIG. 1, binary information is stored in memory cells 2 in the form of counter-rotating circulating currents in superconductive loops 3 of memory cells 2. Each of superconductive loops 3 has an actuable storage device disposed therein which is capable of carrying Josephson currents. In FIG. 1, these devices in a 2×2 portion of superconductive memory array 1 are designated by the reference characters J1–J4. Devices J1–J4 may be Josephson junction devices which are well known to those skilled in the Josephson art. In FIG. 1, current sources 4 provide enabling or gate current to memory cells 2; portions of which are arranged in series to form columns of memory cells in a well known manner. Current sources 4 are selectively separately actuable pulse sources also well known to those skilled in the Josephson art. Switches 5 disposed in series with current sources 4, when closed, connect current sources 4 to memory cells 2. In a similar way, current sources 6 provide control currents via switches 7 to control lines 8 which are disposed in electromagnetically coupled relationship with devices J1–J4 of memory cells 2. Current from current sources 4, 6 provide the two half-select currents which, when they coincide, store information in memory cells 2. Current sources 4 are adapted to provide pulses of positive and negative polarity while current sources 6 are adapted to provide a current of one polarity, positive polarity, for example. Sense gates 9 which are adapted to carry Josephson current and may be any well known Josephson junction device are disposed in electromagnetically coupled relationship with a portion of superconductive loop 3 of memory cells 2 and, as shown in FIG. 1, pairs of sense gates 9 are connected to current sources 10 via switches 11 and sense line 12. Current sources 6, 10 like current sources 4 are selectively separably actuable pulsed sources of current well known to those skilled in the Josephson art.

While the arrangement of FIG. 1 has been simplified for purposes of explanation, it should be appreciated that half-select currents could be applied to the rows and columns of array 1 by means of decoders which are also well known to those skilled in the Josephson art.

In bit-oriented, random access array 1, a portion of which is shown in FIG. 1, binary information is written into each memory cell 2 in random fashion by applying a current to a column of memory cells 2 and another current to one of the control lines 8. Where an enabling current and a control current are coincidentally applied, that memory cell has binary information written therein in the form of a stored circulating current which may be clockwise or counterclockwise to represent the binary digits "1" and "0", respectively. Thus, if it is intended to store binary information in upper left memory cell 2 which includes storage device J1, leftmost current source 4 and uppermost current source 6 apply enabling current and control current, respectively, to memory cell 2 otherwise designated as memory cell A in FIG. 1 when their associated switches 5 and 7 are closed. Enabling current, otherwise designated as current Iy in FIG. 1, when applied to memory cell A, splits into currents il, ir, the magnitudes of these currents being in inverse proportion to the values of inductance of the branches 13, 14 of superconductive loop 3. Assuming, for purposes of explanation, that the inductances of branches 13, 14 are equal, currents il, ir are equal and are equal to Iy/2. Enabling current Iy splits in the same manner in the bottom left memory cell 2 otherwise designated in FIG. 1 as memory cell B. Once the enabling current is established in memory cell A, control current, otherwise designated as Ix in FIG. 1, is applied from leftmost current source 6 via closed switch 7 to control line 8. When this occurs, device J1 switches to the voltage state in a well known manner in response to the control magnetic field generated by current flowing in control line 8. Current Iy is now diverted into branch 13 such that Iy=il. When control current Ix is removed by opening switch 7, device J1 resets to its zero voltage state, but current Iy=il continues to flow in branch 13 of loop 3. When current Iy is removed by opening switch 5, flux conservation in the loop requires that il=ir=Iy/2, and a persistent, circulating current in the counterclockwise direction flows in superconductive loop 3 of memory cell A. This condition may be defined as a binary "0". By reversing the direction of current flow of current Iy, a circulating current in the clockwise direction representative of a binary "1" may be stored in superconducting loop 3 of memory cell A when a control current Ix is applied simultaneously with Iy. The above described manner of storing information in a memory cell 2 of a prior art array is well known and, if only memory cell A of FIG. 1 were considered, no difficulties would be encountered. However, in the real world, fabrication conditions do not permit the formation of memory cells 2 which are identical even within the same array. Under such circumstances, spurious writing of other memory cells 2 may occur where information in the form of a circulating current is present in one memory cell and another memory cell is addressed. Focusing now on rightmost memory cell 2, otherwise identified in FIG. 1 as memory cell C, and assuming a counterclockwise circulating current equal to Iy/2 is flowing in superconducting loop 3 thereof, if memory cell A is being addressed to store information in it, control current Ix is flowing in control line 8 which is associated with both memory cells A and C. Under such circumstances, the storage device J3 of memory cell C may switch to the voltage state, interrupting the circulating current flowing in loop 3 thereof and destroying the previously stored information. This is usually the situation which can only be guarded against by having relatively tighter fabrication parameter tolerances in all cells leading to further design constraints, lower density and no guarantee of solving the problem of spurious writing. Thus, while memory cell C in FIG. 1 has been identified as being potentially a problem cell, it should be appreciated that each memory cell associated with the control line having a current Ix flowing therein is a candidate for spurious writing or destruction of previously stored information. In a large array, this represents a considerable number of cells each time a control line is addressed. In addition, when other control lines are addressed, the same possibility for spurious writing arises. With respect to memory cell B in FIG. 1, the presence of Iy/2 in each branch of superconducting loop 3 in addition to a clockwise or counterclockwise circulating current equal to Iy/2 presents no problem inasmuch as the threshold of storage device J2 can easily be designed to be much greater than Iy. With respect to lower rightmost cell 2 otherwise identified in FIG. 1 as memory cell D, spurious switching is not a problem when memory cell A is addressed because, under those circumstances memory cell D encounters neither currents Iy nor Ix and though a circulating current may be flowing in its superconducting loop, spurious switching is not possible.

Information stored in memory cells 2 in FIG. 1 may be sensed by the simultaneous application of current Iy and Is to a selected memory cell A, for example. Current Is is applied to sense gate 9 of memory cell A from current source 10 via switch 11 and control line 12. Since device J1 of memory cell A is in the zero voltage state, current Iy splits into current i1, ir. Assuming that a counterclockwise current is stored in memory cell A of FIG. 1, sense gate 9 of memory cell A encounters its own gate current Is, current Iy/2 and current ir. Since circulating current Iy/2 is counterclockwise and in opposition to current ir which is also equal to Iy/2, these currents effectively cancel in that part of superconducting loop 3 which is disposed in electromagnetically coupled relationship with sense gate 9. Accordingly, sense gate 9 does not switch and no current change is seen by a sense amplifier (not shown) and a binary "0" is sensed. If the circulating current in memory cell A were clockwise, the circulating current Iy/2 and ir which is equal to Iy/2 would be additive in that portion of superconductive loop 3 which is disposed in electromagnetically coupled relationship with sense gate 9 and sense gate 9 would switch to the voltage state causing a change in current in sense line 12. A binary "1" would thus be detected in a sense amplifier (not shown) connected to sense line 12.

Figure 2:
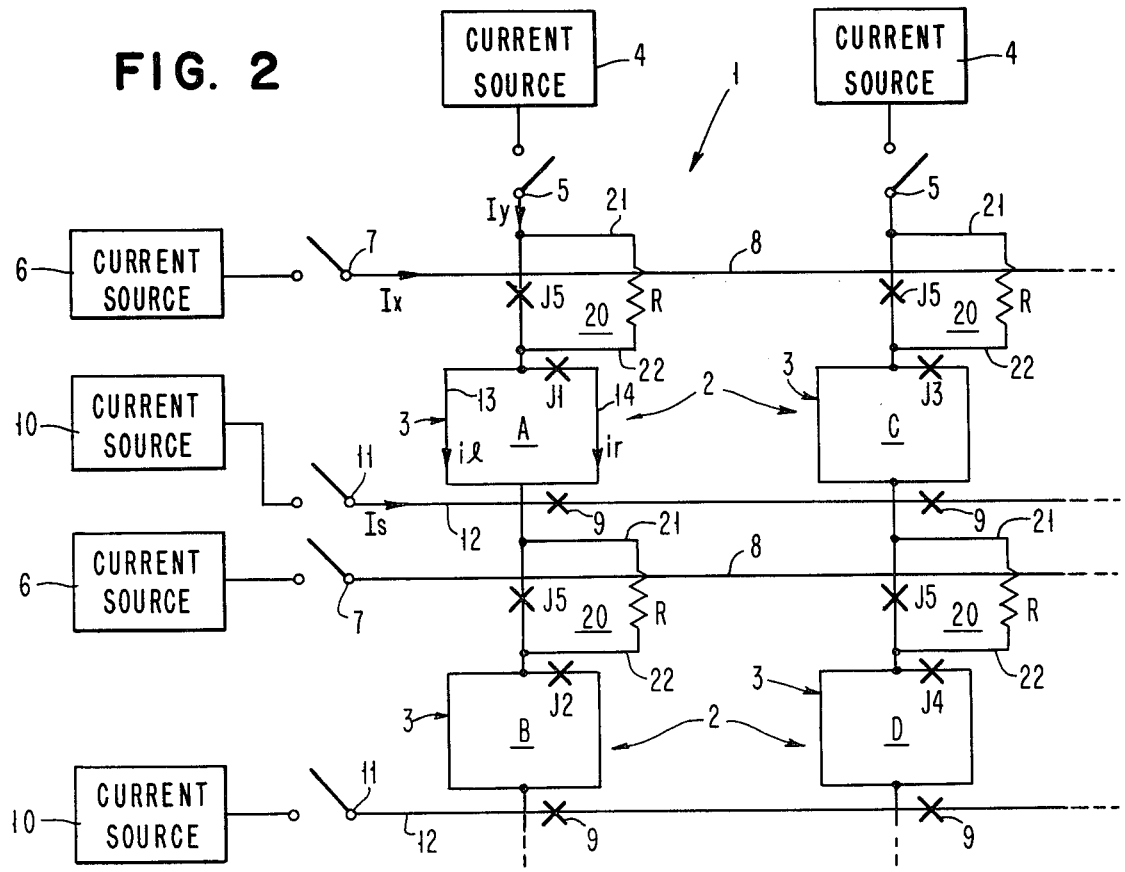
FIG. 2 is a schematic diagram of a portion of a superconductive random access memory wherein only a selected memory cell of the array encounters a control magnetic field which is applied simultaneously with a gate or enabling current to store information in the selected memory cell (local). A serially disposed switchable device shunted by a current path has enabling current diverted into it when the switchable device is actuated by means of a half-select current. A portion of the current path disposed in electromagnetically coupled relationship with the actuable storage device of the selected memory cell switches that device storing information in only the selected memory cell.

From the foregoing, it should be clear that the problem of spurious writing exists during a writing or storing operation in any memory cell 2 which encounters a control current Ix and that cell is already storing information in the form of clockwise or counterclockwise circulating currents. The problem of spurious writing can be overcome by the circuit arrangements shown in FIGS. 2-6 which will be described in what follows. Referring now to FIG. 2, there is shown therein a schematic diagram of a portion of a memory array wherein information is stored in individual cells in a manner similar to that discussed in connection with FIG. 1. In FIG. 2, elements which are the same as those shown in FIG. 1 have been given the same reference characters. Thus, FIG. 2 is identical to the arrangement shown in FIG. 1 except for magnetic control field means 20 which applies a control magnetic field to only a selected one of memory cells 2 of array 1. Control magnetic field means 20 includes a switchable device J5 disposed in series with each of memory cells 2. Each of switchable device J5 is shunted by a current path 21 which includes a terminating resistance R which can have a value of resistance sufficient to cause switchable device J5 to be latching or self-resetting as is already well known to those skilled in the Josephson art. Each current path 21 has a portion 22 thereof which is disposed in electromagnetically coupled relationship with the storage devices J1-J4 of memory cells A-D. Switchable device J5 is controlled by current which flows in control lines 8 portions of which are disposed in electromagnetically coupled relationship with switchable devices J5 of memory cells A-B.

The storing or writing of information into memory cell A, for example, is achieved by applying currents Iy, Ix from current sources 4, 6, respectively, upon the closing of switches 5, 7 respectively. Current Iy may be of either positive or negative polarity to store clockwise or counterclockwise circulating currents in superconductive loop 3 of memory cell A. In FIG. 2, however, control current Ix controls switchable device J5 which is disposed in series with loop 3 of memory cell A and carries enabling current Iy therethrough. Enabling current Iy splits in superconducting loop 3 of memory cell A in the same manner as described in connection with memory cell A of FIG. 1 and currents i1, ir flow in branches 13, 14 respectively of loop 3. When these last mentioned currents are flowing, as described, current Ix is applied to control line 8 causing switchable device J5 to switch to its voltage state; diverting current Iy into current path 21 and portion 22 thereof which is disposed in electromagnetically coupled relationship with device J1 of memory cell A. Storage device J1 of memory cell A now switches and sends current ir along with current i1 into branch 13, setting up a counterclockwise circulating current in superconducting loop 3 of memory cell A when current Ix, Iy are removed in succession. As with the counterclockwise circulating current of memory cell A of FIG. 1, counterclockwise circulating current of memory cell A of FIG. 2 is equal to Iy/2. By simply reversing the direction of Iy, a clockwise circulating current may be set up in superconducting loop 3 of memory cell A of FIG. 2. The significant thing to note is that when current Ix is applied to control line 8, it is not disposed in electromagnetically coupled relationship with any of devices J1-J4 of memory cells A-D, respectively. Accordingly, regardless of what is stored in memory cells A-D, no control magnetic field is applied to the storage devices J2-J4 because, in the instance of memory cell B, though current Iy is applied thereto, no current Ix is applied to control line 8 and device J5 of memory cell B cannot switch, so no current is diverted into current path 21. In the instance of memory cell C, though current Ix is flowing in control line 8 which is also associated with switchable device of J5 of memory cell C, no enabling current Iy is flowing in that J5 device, so switching cannot occur. Accordingly, no current flows in path 21 which could actuate device J3 of memeory cell C. Similarly, memory cell D encounters neither currents Iy nor Ix and, as a result, neither device J4 or switchable device J5 associated with memory cell B can switch.

From the foregoing, it should be clear that when half-select currents are applied to a selected one of the memory cells 2 of array 1 of FIG. 2, only one of memory cells 2 encounters a control magnetic field which is capable of switching the storage device to store information in the selected one of memory cells 2. None of the remaining memory cells of array 1 of FIG. 2 encounter any control magnetic field and, as such, the possibility for spurious switching during writing is totally eliminated. Sensing of information in memory cells 2 of array 1 of FIG. 2 is carried out in exactly the same manner as described in connection with the sensing of information in connection with FIG. 1.

Figure 3:
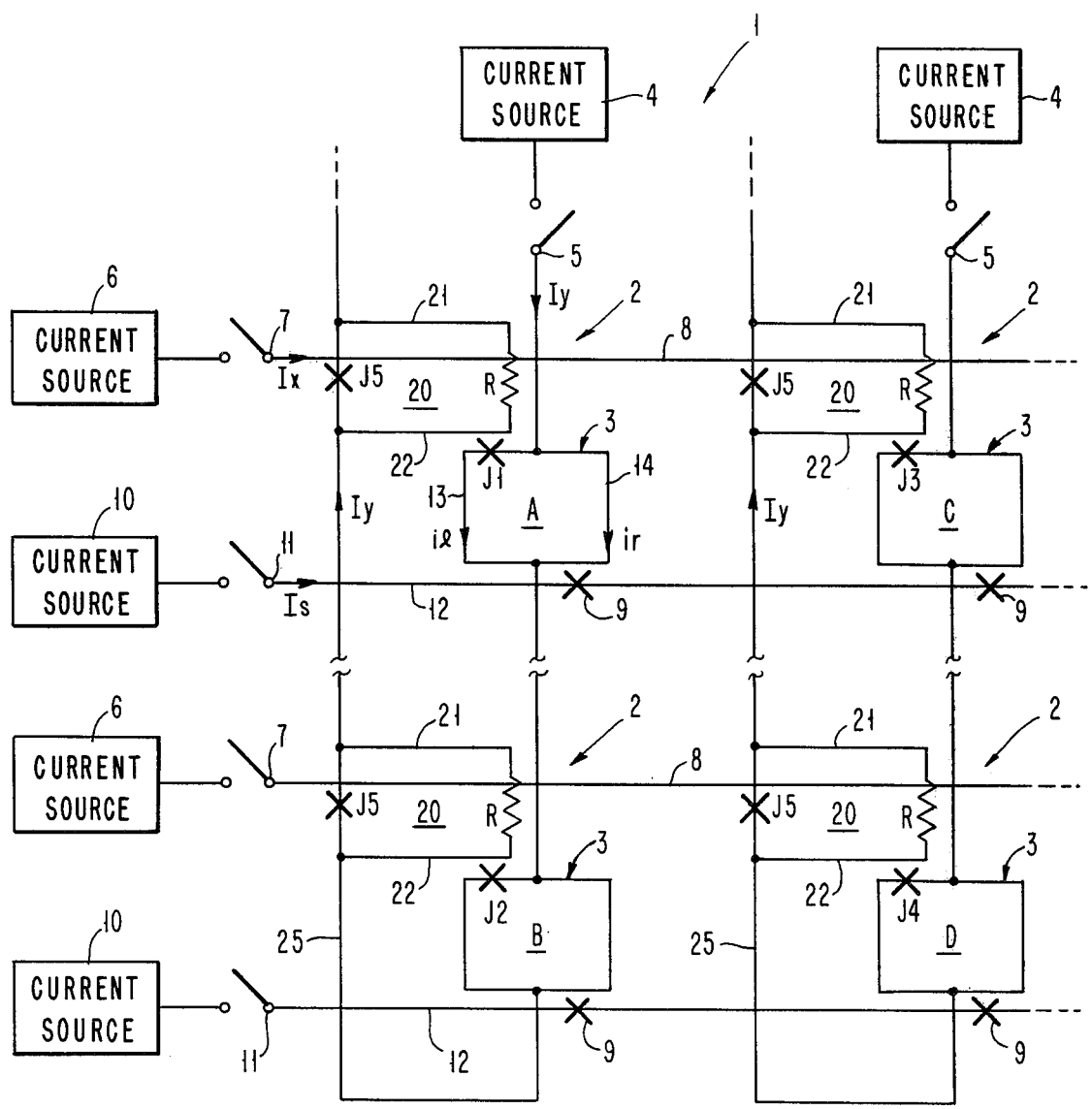
FIG. 3 is a schematic diagram of a superconductive random access memory which is similar in configuration and operation to the array of FIG. 2 except that the serially disposed switchable devices are disposed in a return line for the current which enables the selected one of the memory cells. As with the arrangement of FIG. 2, a half-select current switches a switchable device which diverts the enabling current into a conducting path, a portion of which is disposed in electromagnetically coupled relationship with the actuable storage device of the selected memory cell.

Referring now to FIG. 3, there is shown therein a schematic diagram of a portion of a superconductive random access memory array which is similar to the array shown in FIG. 2. The only difference between the embodiment of FIG. 2 and FIG. 3 is that control magnetic field means 20 is disposed in a return line for enabling current Iy and is not disposed immediately in series with each memory cell 2. The same elements in FIG. 3 are identified with the same reference characters as used in connection with the description of FIG. 2. While devices J1–J4 have been placed in the leftmost branches 13 of memory cells 2, this juxtaposition has no impact on the overall operation of array 1 of FIG. 3. As can be seen from FIG. 3, devices J5 are disposed in series with memory cells A, B, or C, D and are disposed in return lines 25 for currents Iy emanating from current sources 4. Thus, when current source 6 is actuated by the closing of switch 7, upper leftmost device J5 switches to the voltage state diverting current Iy which is in leftmost return line 25 into current path 21. Current Iy in path 21 creates a magnetic field via portion 20 which switches device J1 to the voltage state causing binary information to be written into memory cell A in the same manner described in connection with memory cell A of FIG. 2. Reversing Iy, stores an oppositely directed circulating current and sensing is carried out as previously described in connection with FIGS. 1, 2.

From FIG. 3, it may be seen that even though current Ix is applied via control line 8 to memory cell C, no magnetic field is applied to device J3 because no enabling current Iy is flowing in either memory cell C or in rightmost return line 25. While memory cell B experiences enabling current Iy, that memory cell experiences no control current Ix and, memory cell D experiences neither enbling current Iy nor control current Ix. Spurious switching is, therefore, not possible and the inherent write margins of the memory cells A–D of FIG. 3 are enhanced.

Figure 4:
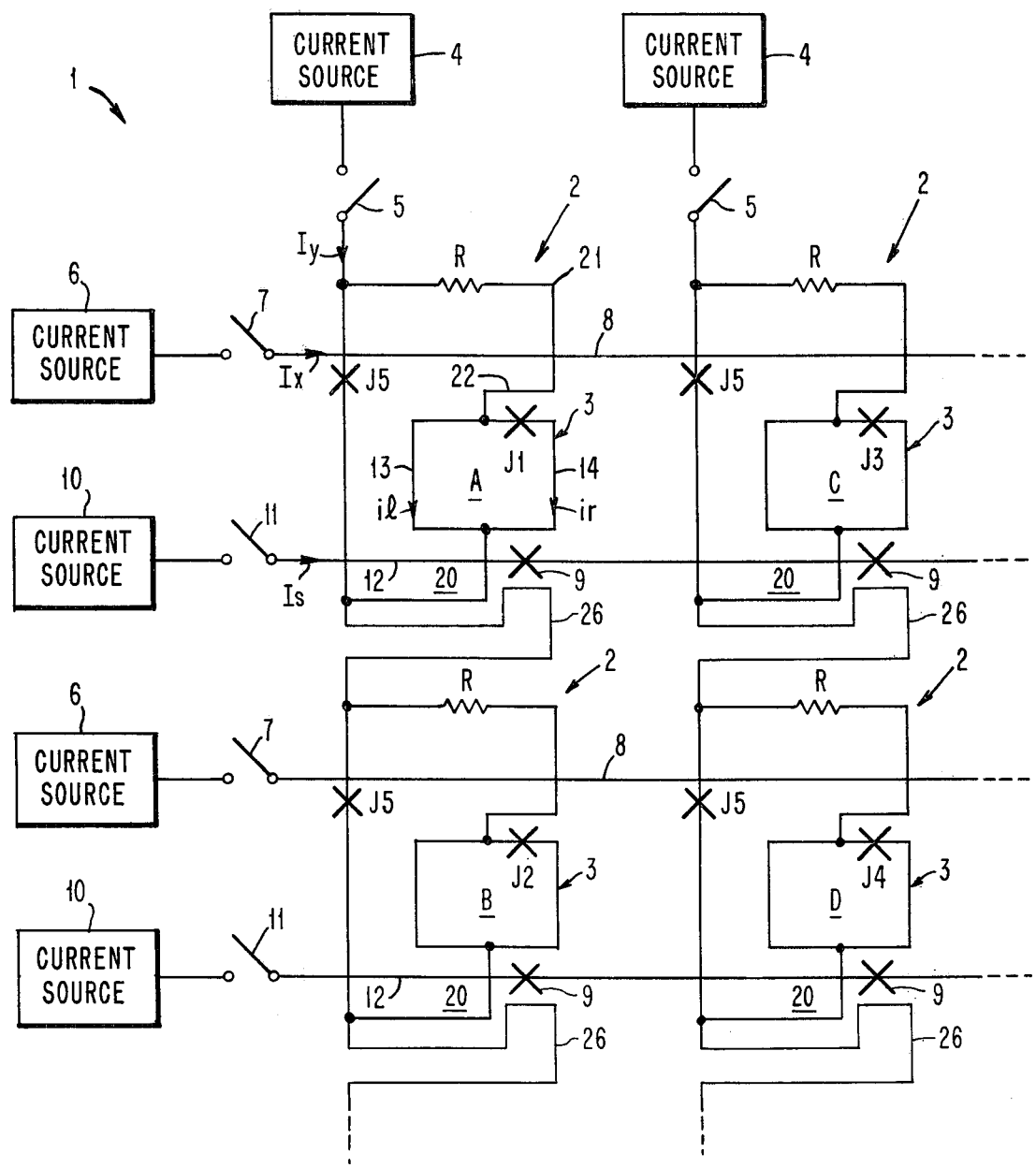
FIG. 4 is a schematic diagram of a portion of a superconductive random access memory which shows the memory cell storage loops with their associated actuable storage devices disposed in series with a current path which, in turn, is disposed in parallel with a switchable device. A plurality of switchable devices connected in series make up a column of the array. The switchable device is controlled by a half-select current which diverts enabling current into the current path which is in series with the selected memory cell. A portion of the current path is disposed in electromagnetically coupled relationship with the storage device of the selected memory cell so that the enabling current provides the control magnetic field which switches the storage device of only the selected memory cell to store information therein.

Referring now to FIG. 4, there is shown a superconductive memory array wherein the enabling current applied to a portion of the memory cells is selectively diverted into a parallel circuit path, a portion of which is disposed in electromagnetically coupled relationship with the storage device of a memory cell serially disposed in the path causing information to be stored in that cell without spuriously affecting information stored in adjacent cells which are associated with the same applied half-select current. Elements in FIG. 4 which are the same as elements in the previous figures are identified with the same reference characters. Thus, array 1 of FIG. 4 is similar to arrays 1 of FIGS. 2, 3 except that switchable device J5 instead of being in series with superconducting loops 3 are now disposed in parallel with superconducting loops 3 and, loops 3 are disposed in series with circuit path 21. In the instance of FIG. 4, like the arrangement of FIGS. 2, 3 enabling current Iy is diverted by the switching of a switchable device J5 into a circuit path 21 and a portion 22 thereof which is disposed in electromagnetically coupled relationship with a storage device disposed in superconducting loop 3. In FIG. 4, when control current Ix is applied to switchable device J5 of memory cell A simultaneously with enabling current Iy, device J5 switches to the voltage state, diverting enabling current Iy into circuit path 21 and portion 22 thereof. Current Iy is portion 22 switches device J1 to the voltage state storing a circulating current in superconducting loop 3 when currents Iy, Ix are removed. Reversing the polarity of enabling current Iy stores a circulating current opposite to that stored when the first polarity enabling current was applied. Sensing is carried out in the same manner described in connection with the previous figures by the application of enabling current Iy to one of sense gates 9 via control line portions 26 which are disposed in electromagnetically coupled relationship with sense gates 9 and the application of sense currents to one of sense lines 12 from current sources 4, 10, respectively. In connection with FIG. 4, it should be noted that when current Ix is applied to control line 8, device J5 of memory cell C also experiences a control magnetic field. However, device J5 does not switch, since enabling current Iy is not flowing in device J5. Accordingly, no control magnetic field can be generated which will switch storage device J3 of memory cell C. Memory cell B does not experience current Ix and memory cell D experiences neither enabling current Iy nor current Ix. In FIG. 4, resistor R in current path 21 may have a value which makes switchable device J5 of memory cell A–B either latching or self-resetting. In any event, when current sources 4–6 are turned off and all devices J5 would then reset to their zero voltage state. The arrangement of FIG. 4 has enhanced write margins as a result of the application of control magnetic field to the storage device of only selected memory cell 2 of array 1.

Figure 5:
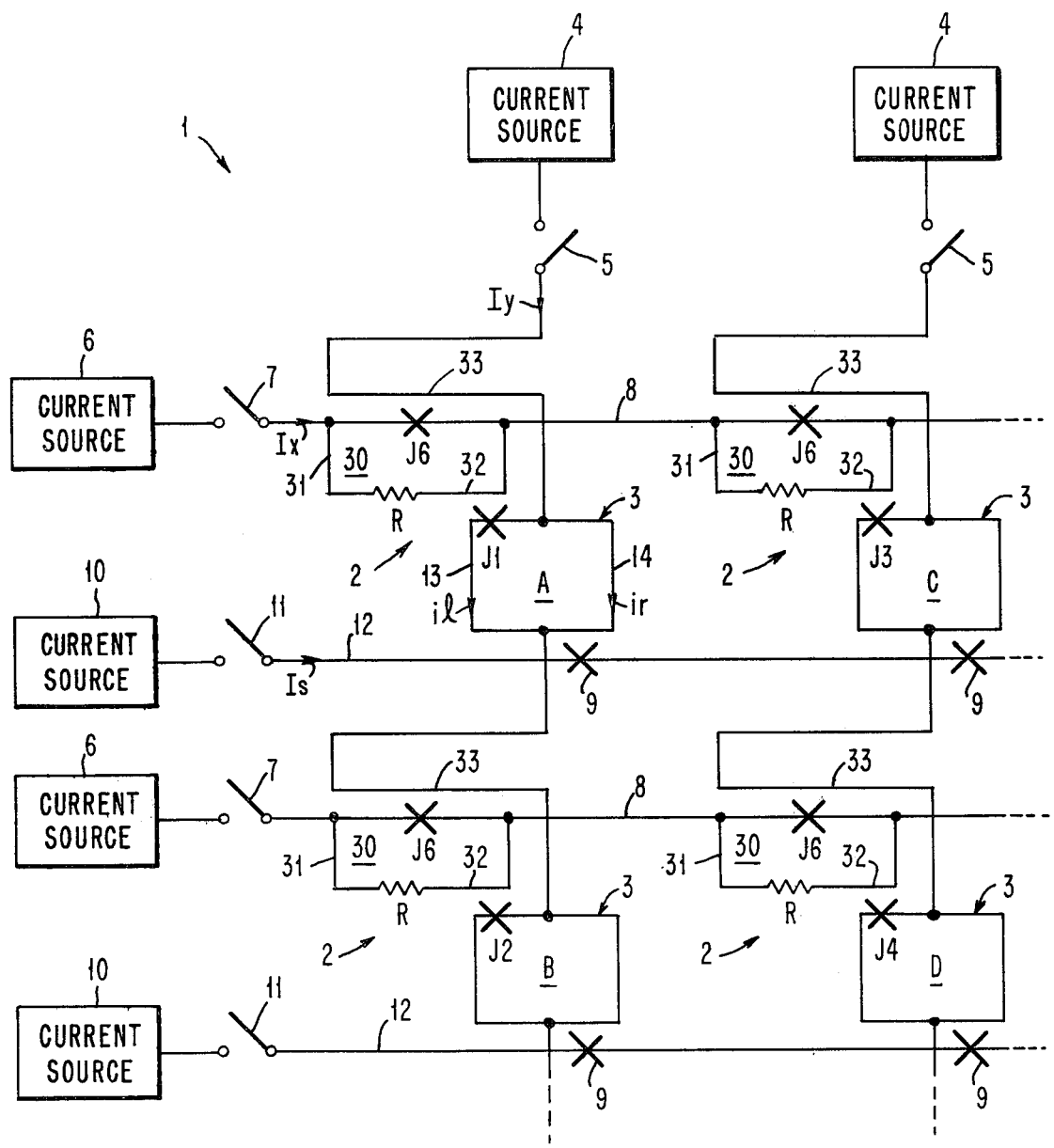
FIG. 5 is a schematic diagram of a superconductive random access memory wherein the control magnetic field is applied to the actuable storage device of a selected memory cell by means of a portion of a current path which diverts a current different from the enabling current into the current path when a switchable device actuated by the enabling current switches it. In the arrangement of FIG. 5, the current different from the enabling current is a half-select current. Since all the non-selected cells do not encounter one or the other of the half-select currents, spurious switching of an unselected cell cannot take place.

Referring now to FIG. 5, there is shown therein a schematic diagram of a superconductive memory array wherein the means for applying at least a control magnetic field to only one of the memory cells simultaneously with an enabling current includes means for diverting a current different from the enabling current into electromagnetically coupled relationship with the actuable device of a selected one of the memory cells.

Where the elements of FIG. 5 are the same as those of the previous figures, these elements are identified with the same reference characters. Thus, array 1 of FIG. 5 is the same as array 1 of FIG. 2 except that the control magnetic field means 20 of FIG. 2 has been substituted for by control magnetic field means 30 in FIG. 5. Control magnetic field means 30 includes switchable devices J6 serially disposed in control lines 8. Control magnetic field means 30 includes current paths 31, resistances R and portions 32 of current paths 31 disposed in electromagnetically coupled relationship with devices J1–J4 of memory cells A–D, respectively. Control magnetic field means 30 also includes a control line portion 33 in which enabling current Iy flows disposed in electromagnetically coupled relationship with switchable devices J6.

Array 1 of FIG. 5 stores or writes information in memory cell A, for example, by the application of enabling current Iy and a current different from the enabling current Ix to memory cell A. Assuming that enabling current Iy is applied to memory cell A, enabling current Iy flows in control line portion 33 enabling gate J6 so that when current Ix is applied to control line 8, switchable device J6 switches to the voltage state diverting current Ix into current path 31. Current Ix now flows in portion 32 which is disposed in electromagnetically coupled relationship with storage device J1 of memory cell A switching that device and storing a circulating current in superconductive loop 3 in the same manner as described previously. The reversal of enabling current Iy produces a circulating current of the opposite sense in superconducting loop 3 of memory cell A. Considering now memory cell C, it is seen that even though current Ix is flowing in control line 8, switchable device J6 of memory cell C cannot switch because enabling current Iy is not flowing in control line portion 33 of memory cell C. With respect to memory cell B even though enabling current Iy is flowing in control line portion 33 of cell B, device J6 does not switch because current Ix is not present. With respect to memory cell D, that cell experiences neither enabling current Iy nor current Ix. Thus, spurious switching cannot take place in any other cell of the array because the conditions which would cause spurious switching have been eliminated by the arrangement of FIG. 5. Sensing in FIG. 5 is carried out in the same manner described in connection with the previous FIGS.

Figure 6:
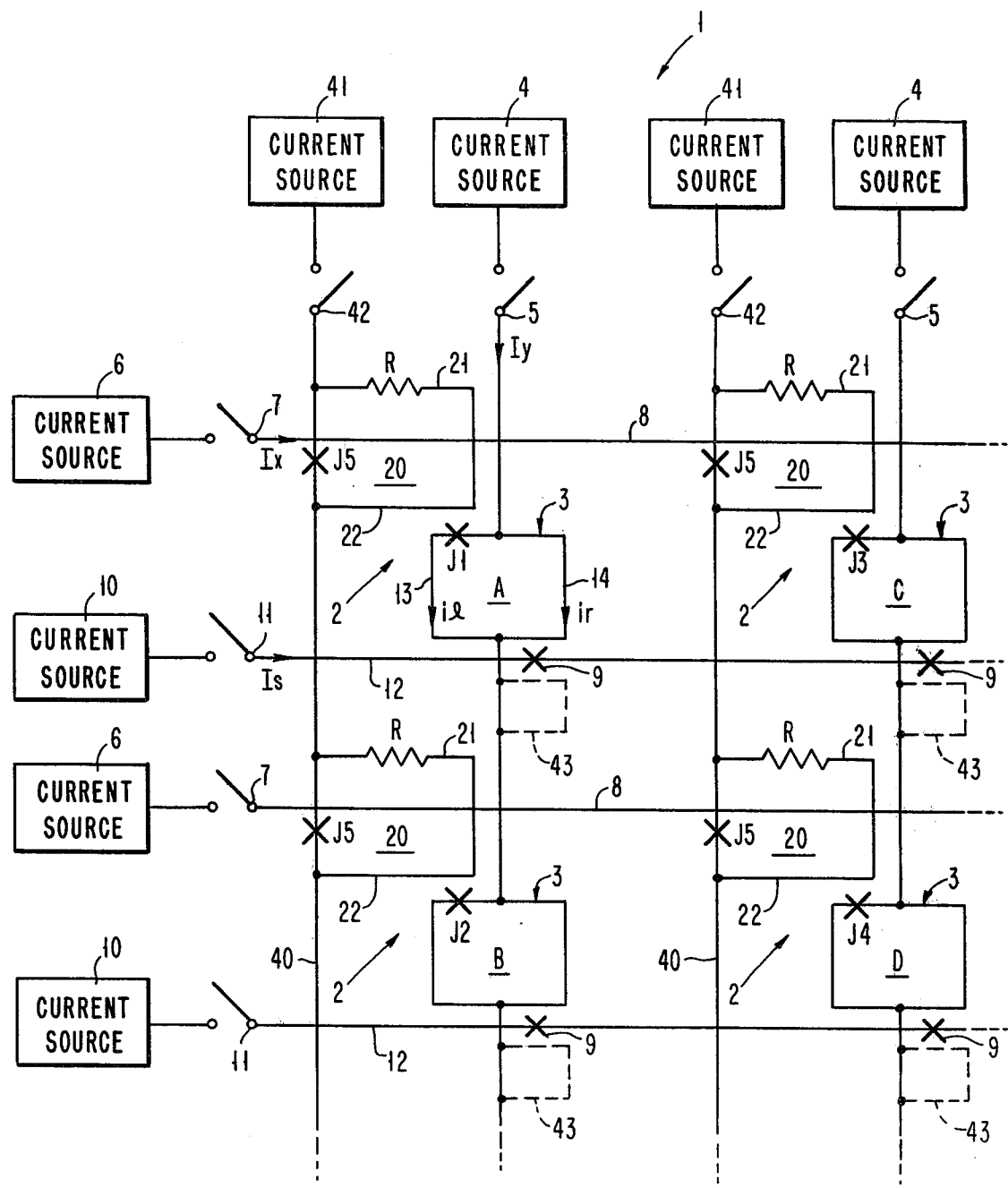
FIG. 6 is a schematic diagram of a portion of a superconductive random access memory cell wherein a current different from the enabling current is utilized to apply a control magnetic field to the storage device of only a selected memory cell. Control magnetic field is applied to only a selected memory cell by means of a switchable device which is shunted by a current path, a portion of which is disposed in electromagnetically coupled relationship with the actuable storage device of the selected memory cell. The switchable device is one of a plurality of switchable devices connected in series and is controlled by a half-select current which diverts the current different from the enabling current into the portion of the current path to apply a control magnetic field simultaneously with an enabling current to store information in the selected memory cell.

Referring now to FIG. 6 there is shown therein a schematic diagram of a superconductive memory array wherein a current different from the enabling current is utilized to switch a switchable device which in turn diverts the current different from the enabling current into a portion of a current path which is disposed in electromagnetically relationship with the storage device of a selected memory cell. Array 1 of FIG. 6 is practically identical to array 1 of FIG. 3 except that return line 25 has been eliminated and a separate line with a separate current source is utilized one for each column of memory cells 2. To the extent that FIG. 3 and FIG. 6 are quite similar, the elements of FIG. 6 which are the same as the elements in FIG. 3 are identified with the same reference characters. The differences between the two figures are that return lines 25 of FIG. 3 have been substituted for by separate lines 40 in FIG. 6 and separate current sources 41 are connected thereto via switches 42. To the extent that current sources 4, 6 and 41 can be energized at the same time to provide enabling current Iy to memory cell A, current Ix to control line 8 and current Iy' to line 42, respectively, the storage of information in memory cell A can be exactly as described in connection with the operation of FIG. 3. Thus, clockwise and counterclockwise circulating currents can be stored by applying positive and negative polarity of enabling current Iy.

In another mode where only a single circulating current is utilized to represent one binary condition and no circulating current is utilized to represent the other binary condition, enabling current Iy is applied simultaneously with current Ix and current Iy' from current source 41 to achieve the circulating current condition while only currents Iy' and Ix are applied to achieve the no circulating current condition. In the no circulating current condition, device J5 is switched to the voltage state by the presence of currents Iy' and Ix diverting current Iy' into circuit path 21 and portion 22 thereof. If there is no circulating current present in superconducting loop 3 of memory cell A, nothing happens and no circulating current is stored in superconductive loop 3. Where, however, a circulating current is present in superconductive loop 3, the presence of current Iy' in portion 22 of circuit path 21 causes device J1 of memory cell A to switch to the voltage state thereby destroying the circulating current present and storing information, for example, a binary "0" in the form of no circulating current. Where a circulating current is to be stored, current source 4 is activated simultaneously with current sources 6 and 41 causing current Iy to be diverted into branch 14 of superconducting loop 3 and causing a circulating current to be set up therein when the current sources are turned off in the usual way. Where branches 13, 14 have similar inductances, the magnitude of the circulating current is Iy/2, but this value can be increased by increasing the inductance of branch 14 to so high a value that the current flowing in device J1 of memory cell A is substantially equal in magnitude to current Iy just prior to its being switched by the appearance of current in portion 22 of circuit path 21. In this way, circulating current of a magnitude approaching the magnitude of current Iy is set up in supeconductive loop 3 so that when a binary "0" is to be stored in superconducting loop 3, device J1 has effectively a gate current equal to current Iy flowing therein. Under such circumstances, sensing is much faster because only one-half the current need by applied to the cell to achieve the same circulating current as in previously described cells. This is achieved in array 1 of FIG. 6 by causing enabling current Iy to control the switching of sense gates 9. Dashed line portions 43 in FIG. 6 show the use of enabling current Iy to simultaneously apply magnetic field to sense gates 9 and enabling current to memory cells A–D.

Like the embodiments of FIGS. 2–5, the circuit arrangement of FIG. 6 permits only memory cell A to encounter a control magnetic field which is capable of switching storage device J1 of memory cell A. Memory Memory cells B–D encounter neither enabling current nor control magnetic field or only one of the enabling current and control magnetic field. Thus, spurious switching of any other cell during writing of a selected one of memory cells 2 is completely eliminated and enhanced write margins for the selected one of the memory cells 2 are available.

The storage devices and the switchable Josephson devices mentioned hereinabove in connection with FIGS. 2–6 may be any well known type of Josephson junction or may be a multiple junction device known as an interferometer. In addition, all the interconnection circuitry like control line 8, return lines 25 and the conductors or superconducting loops 3 are made from materials which are superconductive at the temperature of liquid helium (approximately 4.2°K.). Typical Josephson junction and interconnection circuitry which may be utilized in the practice of the present invention are shown in U.S. Pat No. 3,758,795, Ser. No. 267,841, filed June 30, 1972 and assigned to the same assignee as the present invention. A typical fabrication technique for forming Josephson junction devices is shown in U.S. Pat. No. 3,849,276, Ser. No. 125,993, filed Mar. 19, 1972 which is also assigned to the same assignee as the present invention. Resistances R which must not be superconductive at the circuit operation temperature may be fabricated with compatible materials which display resistance at the desired operating temperature. U.S. Pat. No. 3,913,120, Ser. No. 429,461, filed Dec. 28, 1973 and assigned to the same assignee as the present invention shows a material and method of fabrication for circuitry and a resistor which may be utilized in the practice of the present invention.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A superconductive random access memory comprising:
    a plurality of memory cells arranged in array fashion wherein information is stored in individual memory cells in the form of at least a single circulating current,
    means coupled to a plurality of portions of said memory cells for applying an enabling current to one of said portions which includes a selected one of said memory cells, and
    means connected to said memory cells for applying at least a control magnetic field to only said selected one of said memory cells simultaneously with said enabling current to store information in said selected one of said memory cells.

2. A superconductive random access memory array according to claim 1 further including means connected to said memory cells for sensing information stored in only said selected one of said memory cells.

3. A superconductive random access memory according to claim 1 wherein said memory cells each include a storage loop having at least an actuable device capable of carrying Josephson current disposed therein and wherein said means for applying an enabling current includes a selectively separately actuable current source serially connected to each of said portions.

4. A superconductive random access memory according to claim 3 wherein said selectively separately actuable current source is a pulsed current source adapted to deliver currents of positive and negative polarity.

5. A superconductive random access memory according to claim 3 wherein said selectively separately actuable current source is a pulsed source of unipolar currents.

6. A superconductive random access memory according to claim 3 wherein said means for applying at least a control magnetic field to only one of said memory cells simultaneously with said enabling current includes means for diverting a current different from said enabling current into electromagnetically coupled relationship with said an actuable device of said selected one of said memory cells.

7. A superconductive random access memory according to claim 6 wherein said means for diverting a current different from said enabling current into electromagnetically coupled relationship with said an actuable device of said selected one of said memory cells includes a selectively actuable source of said current different from said enabling current, a switchable device disposed in series with said selectively actuable source, a superconductive current path shunting said switchable device, a portion of said current path being disposed in electromagnetically coupled relationship with said actuable device of said selected one of said memory cells, and, means disposed in electromagnetically coupled relationship with said switchable device for switching it to divert said current different from said enabling current into said portion of said current path and to switch said actuable device of said selected one of said memory cells.

8. A superconductive random access memory array according to claim 7 wherein said means disposed in electromagnetically coupled relationship with said switchable device includes a conductive element serially connected with said current source of enabling current and said selected one of said memory cells said element carrying said enabling current and being disposed in electromagnetically coupled relationship with said switchable device.

9. A superconductive random access memory according to claim 7 wherein said means disposed in electromagnetically coupled relationship with said switchable device includes a control line disposed in electromagnetically coupled relationship with said switchable device and an additional selectively separately actuable source of control current connected to said control line.

10. A superconductive random access memory according to claim 7 wherein said selectively separately actuable current source of enabling current is a pulsed source adapted to generate currents of positive and negative polarity.

11. A superconductive random access memory according to claim 7 wherein said selectively separately actuable current source of enabling current is a pulsed source adapted to generate currents of a single polarity.

12. A superconductive random access memory array according to claim 7 further including a resistance serially disposed in said current path the value of which is sufficient to latch said switchable device.

13. A superconductive random access memory array according to claim 7 further including a resistance serially disposed in said current path the value of which is sufficient to render said switchable device self-resetting.

14. A superconductive random access memory according to claim 3 wherein said means for applying at least a control magnetic field to only said selected one of said memory cells simultaneously with said enabling current includes means for diverting said enabling current into electromagnetically coupled relationship with said an actuable device of said selected one of said memory cells.

15. A superconductive random access memory array according to claim 14 wherein said means for diverting said enabling current into electromagnetically coupled relationship with said an actuable device of said selected one of said memory cells includes a switchable device disposed in series with said selected one of said memory cells, a current path shunting said switchable device, a portion of said current path being disposed in electromagnetically coupled relationship with said actuable device of said selected one of said memory cells, and meams disposed in electromagnetically coupled relationship with said switchable device for switching it to divert said enabling current into said portion of said current path and to switch said actuable device of said selected one of said memory cells.

16. A superconducting random access memory array according to claim 15 wherein said means disposed in electromagnetically coupled relationship with said switchable device includes a control line disposed in electromagnetically coupled relationship with said switchable device and a selectively separately actuable current source of control current connected to said control line.

17. A superconducting random access memory cell according to claim 15 wherein said selectively separately actuable current source of enabling current is a pulsed source adapted to generate currents of positive and negative polarity.

18. A superconductive random access memory array according to claim 15 further including a resistance serially disposed in said current path the value of which is sufficient to latch said switchable device.

19. A superconductive random access memory array according to claim 15 further including a resistance serially disposed in said current path the value of which is sufficient to render said switchable device self-resetting.

20. A superconductive random access memory according to claim 14 wherein said means for diverting said enabling current into electromagnetically coupled relationship with said an actuable device of said selected one of said memory cells includes a switchable device disposed in series with said a current source and in parallel with said selected one of said memory cells, a current path shunting said switchable device said current path being disposed in series with said selected one of said memory cells and having a portion thereof disposed in electromagnetically coupled relationship with said actuable device of said selected one of said memory cells, and means disposed in electromagnetically coupled relationship with said switchable device for switching it to divert said enabling current into said portion of said current path and to switch said actuable device of said selected one of said memory cells.

21. A superconducting random access memory array according to claim 20 wherein said means disposed in electromagnetically coupled relationship with said switchable device includes a control line disposed in electromagnetically coupled relationship with said switchable device and a selectively separately actuable current source of control current connected to said control line.

22. A superconducting random access memory according to claim 20 wherein said selectively separately actuable current source of enabling current is a pulsed source adapted to generate currents of positive and negative polarity.

23. A superconductive random access memory array according to claim 20 further including a resistance serially disposed in said current path the value of which is sufficient to latch said switchable device.

24. A superconductive random access memory array according to claim 20 further including a resistance serially disposed in said current path the value of which is sufficient to render said switchable device self-resetting.

* * * * *